United States Patent

Sashida et al.

[11] Patent Number: 5,756,260
[45] Date of Patent: May 26, 1998

[54] PHOTOSENSITIVE POLYIMIDE RESIN COMPOSITION CONTAINING A STABILIZER AND METHOD FOR FORMATION OF RELIEF PATTERN USING SAME

[75] Inventors: Nobuyuki Sashida; Toshio Banba; Naoshige Takeda, all of Utsunomiya; Mitsuhiro Yamamoto, Hiroshima, all of Japan

[73] Assignee: Sumitomo Bakelite Company Limited, Tokyo, Japan

[21] Appl. No.: 732,836

[22] Filed: Oct. 15, 1996

Related U.S. Application Data

[63] Continuation of Ser. No. 313,102, filed as PCT/JP94/60231, Feb. 16, 1994, abandoned.

[30] Foreign Application Priority Data

| Feb. 16, 1993 | [JP] | Japan | 5-026400 |
| Feb. 23, 1993 | [JP] | Japan | 5-033202 |
| Mar. 22, 1993 | [JP] | Japan | 5-061544 |

[51] Int. Cl.$^6$ .................................................. G03C 1/73
[52] U.S. Cl. ............................ 430/283.1; 430/287.1; 522/164
[58] Field of Search ................... 430/283.1, 287.1, 430/325; 522/164

[56] References Cited

U.S. PATENT DOCUMENTS

| 4,040,831 | 8/1977 | Rubner et al. | 430/325 |
| 4,481,280 | 11/1984 | Fujikawa et al. | 430/281.1 |
| 4,550,069 | 10/1985 | Pampalone | 430/165 |
| 4,980,268 | 12/1990 | Bartmann et al. | 430/283.1 |
| 5,114,826 | 5/1992 | Kwong et al. | 430/192 |
| 5,262,277 | 11/1993 | Sato et al. | 430/283.1 |

FOREIGN PATENT DOCUMENTS

| 617837 | 1/1986 | Japan | G03C 1/72 |
| 61-254605 | 11/1986 | Japan | C08F 2/48 |
| 1293341 | 11/1989 | Japan | G03C 1/72 |
| 4116557 | 4/1992 | Japan | G03F 7/027 |
| 4120542 | 4/1992 | Japan | G03F 7/038 |
| 4120543 | 4/1992 | Japan | G03F 7/075 |
| 4291258 | 10/1992 | Japan | G03F 7/038 |
| 5127383 | 5/1993 | Japan | G03F 7/038 |
| 5127384 | 5/1993 | Japan | G03F 7/038 |

OTHER PUBLICATIONS

Sashida et al. —English Translation of JP 5-127384, May 1993.
Sashida et al. —English Translaiton of JP 4-120543, Apr. 1992.

*Primary Examiner*—Bernard P. Codd
*Attorney, Agent, or Firm*—Browdy and Neimark

[57] ABSTRACT

By using a polyamic acid ester comprising the following structural units (1a), (1b) and (1c) as a photosensitive resin and a sulfonamide compound or a specific glycol ether acetate as a stabilizer, a photo-sensitive resin composition excellent especially in viscosity stability can be obtained, and by using the above photosensitive resin and a specific developer, a relief pattern of high resolution can be formed.

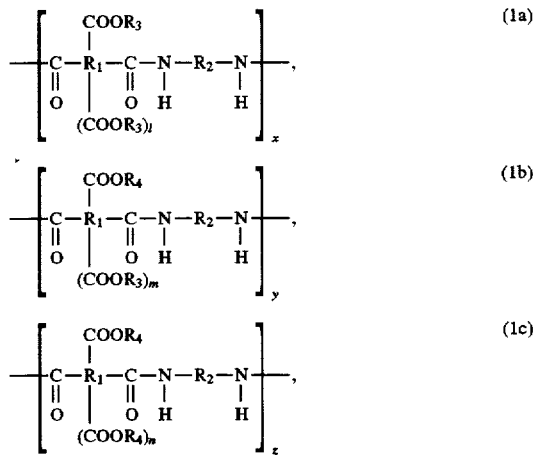

(the symbols in the formulas are as defined in the specification)

7 Claims, No Drawings

PHOTOSENSITIVE POLYIMIDE RESIN COMPOSITION CONTAINING A STABILIZER AND METHOD FOR FORMATION OF RELIEF PATTERN USING SAME

This application is a continuation of application Ser. No. 08/313,102, filed Sep. 30, 1994 now abandonded, Dec. 8, 1995 which is a 371 of PCT/JP94/60231 filed Feb. 16, 1994.

TECHNICAL FIELD

The present invention relates to a photo-sensitive resin composition from which a film excellent in smoothness and free from pin holes can be easily formed on a support such as a silicon wafer by spin coating or the like, and which is excellent in shelf stability and viscosity stability of varnish and high in sensitivity, and to a method for producing relief patterns using the composition.

BACKGROUND ART

Hitherto, polyimides which are excellent in heat resistance and are superior in electrical insulation properties and mechanical strength have been used for surface protective films and layer insulation films of semiconductor devices. However, recently a technique to impart photosensitivity to the polyimides per se has been noticed for simplification of the complicated steps for production of polyimide relief patterns.

For example, polyimide precursor compositions in which a photosensitive group is given through an ester group, and which have the structure represented by the following formula are known (Japanese Patent Kokoku No.55-41422).

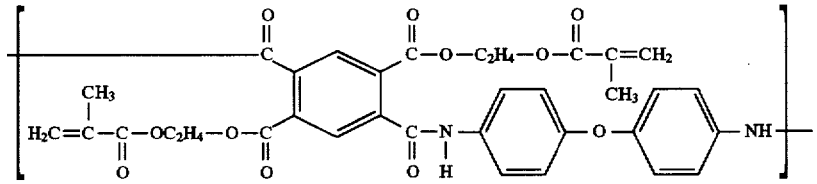

These are dissolved in suitable organic solvents, the resulting solutions are coated in the state of varnish and dried, then the coated film is irradiated with ultraviolet rays through a photo mask, developed and rinsed to obtain the desired pattern and the pattern is further heat treated to obtain a polyimide relief pattern.

When polyimides with photosensitivity given are used, not only is pattern formation simplified, but also use of them is safe and hardly causes environmental pollution because it is not necessary to use highly toxic etching liquids. Therefore, it is expected that the technique to photosensitize polyimides becomes more important.

However, when such conventional photosensitizing techniques are applied, photosensitive polyimide resin compositions with a photosensitive group introduced through an ester group have the problems that they are low in viscosity stability at room temperature and that cissings or pin holes are apt to occur when they are coated on silicon wafers which are applied to semiconductors or the like. Furthermore, polyimide precursors having such ester group, when dissolved in solvents, greatly change in viscosity in the state of varnish.

Therefore, it has been proposed to add various inhibitors in order to stabilize viscosity or to use mixed solvents or various surface smoothing agents in order to improve coatability. Furthermore, it has been attempted to add phenols or N-nitrosodiarylamine compounds (Japanese Patent Kokai No.61-254605), but the effect is small and more effective viscosity stabilizers have been demanded. For obtaining a relief pattern, the polyamic acid ester is dissolved in a suitable solvent or mixed solvent, and to the solution are added photo-polymerization initiator, sensitizer, copolymerizable monomer or resin, adhesive aid, inhibitor, leveling agent, etc., and the resulting composition in the state of varnish is coated and dried, then irradiated with ultraviolet rays through a photomask, and subjected to development and rinsing treatment to obtain the desired pattern. This is further heat treated to obtain a polyimide relief pattern. The development and rinsing are important for the formation of polyimide pattern. This is because these steps affect the resolution of the pattern, the dimensional accuracy of the pattern, the adhesion to wafers, etc.

Conventionally known developers are one or more of good solvents for polyamic acid esters or mixtures of the good solvents with poor solvents. As the good solvents, mention may be made of N,N-dimethyl-formamide, N,N-dimethylacetamide, N-methyl-2-pyrrolidone, 4-butyrolactone, dimethyl sulfoxide, etc. As the poor solvents, mention may be made of toluene, xylene, ethanol, methanol, iso-propanol, butyl acetate, water, etc.

As for the construction of the developer, there have been known to use an aliphatic or alicyclic ketone of 3–7 carbon atoms alone (Japanese Patent Kokoku No.2-2135), to use a mixture of N,N-dimethylformamide, N,N-dimethylacetamide, N-methyl-2-pyrrolidone, 4-butyrolactone, dimethyl sulfoxide, etc./methanol/ diethylene glycol or its mono- or dialkyl ethers (Japanese Patent Kokai No.58-223149), or to use developers comprising 30–100% by weight of one or two or more of glycol ethers represented by the following formula:

(X=1–4, y=1–4, z=1–4) and 70–0% by weight of one or two or more of N,N-dimethylformamide, N,N-dimethylacetamide, N-methyl-2-pyrrolidone, 4-butyrolactone, dimethyl sulfoxide, tetrahydrofuran, toluene, xylene, ethanol, iso-propanol and butyl acetate (Japanese Patent Kokai No.4-252400).

However, when the above developers are used in formation of relief patterns of photosensitive polyamic acid ester resin composition, there has been the problem that a high resolution cannot be obtained because of the swelling of the exposed and insolubilized layer.

Disclosure of Invention

The present invention has overcome the problems in the conventional photosensitive polyamic acid ester resin compositions, and the present invention provides a photosensitive resin composition which shows no occurrence of cissings and pin holes in coating, can easily give a film excellent in smoothness and is high in sensitivity and excellent in shelf stability and viscosity stability, and a method for producing a relief pattern using the composition.

That is, the present invention relates to the following photosensitive resin composition and method for producing a relief pattern.

(1) A photosensitive resin composition which comprises, as essential components, (A) a polyamic acid ester comprising structural units represented by the following formulas (1a), (1b) and (1c):

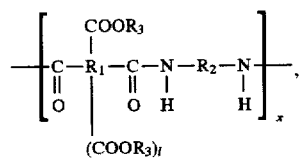

(1a)

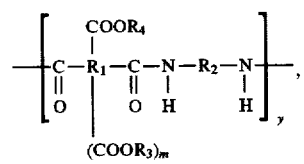

(1b)

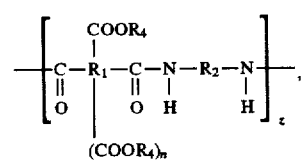

(1c)

wherein

R$_1$: a trivalent or tetravalent organic group,

R$_2$: a divalent organic group

R$_3$:

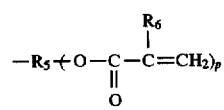

R$_4$:

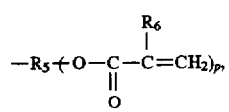

—CH$_3$, or C$_2$H$_5$

R$_5$: a divalent to hexavalent organic group,

R$_6$: H or CH$_3$ group,

R$_1$, R$_2$, R$_3$, R$_4$, R$_5$ and R$_6$ are independent of one another and may be the same or different, l, m, n: 0 or 1, p: an integer of 1–5, x, y, z: mol % of the structural units (1a), (1b), (1c), 0<x, y<100, 0<z<80 and x+y+z=100, and (B) a stabilizer comprising a sulfonamide compound or a glycol ether acetate represented by the following formula (2):

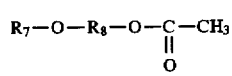

(2)

wherein

R$_7$: —CH$_3$, or —C$_2$H$_5$,

R$_8$: —C$_3$H$_6$, —C$_4$H$_8$—, or —C$_5$H$_{10}$—.

(2) A method for producing a relief pattern which is characterized by using as a starting material a photosensitive resin composition mainly composed of a polyamic acid ester comprising the structural units represented by the following formulas (1a), (1b) and (1c):

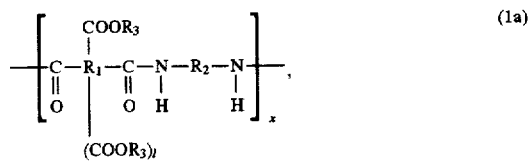

(1a)

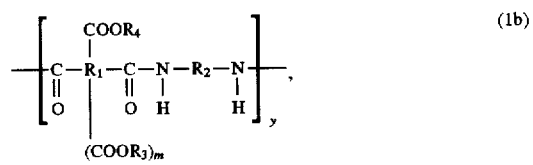

(1b)

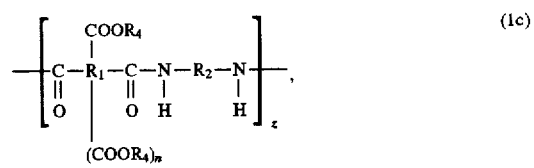

(1c)

wherein

R$_1$: a trivalent or tetravalent organic group,

R$_2$: a divalent organic group

R$_3$:

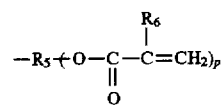

R$_4$:

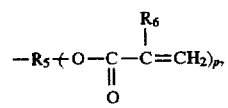

—CH$_3$, or C$_2$H$_5$

R$_5$: a divalent to hexavalent organic group,

R$_6$: H or CH$_3$ group,

R$_1$, R$_2$, R$_3$, R$_4$, R$_5$ and R$_6$ are independent of one another and may be the same or different, l, m, n: 0 or 1, p: an integer of 1–5, x, y, z: mol % of the structural units (1a), (1b), (1c), 0<x, y<100, 0<z<80 and x+y+z=100, and using a developer comprising (A) 10–40% by weight of iso-propanol and (B) 90–60% by weight of one or two or more of N,N-diemthylformamide, N,N-dimethylacetamide, N-methyl-2-pyrrolidone, 4-butyrolactone, dimethyl sulfoxide and tetrahydrofuran.

DETAILED DESCRIPTION OF INVENTION

The polyamic acid esters comprising the structural units represented by the formulas (1a), (1b) and (1c) used in the present invention have a high reactivity and the cured products thereof have good heat resistance, mechanical properties and electric properties.

In the formulas (1a), (1b) and (1c), R$_1$ is derived from compounds having a trivalent or tetravalent organic group, and normally aromatic tetracarboxylic acids or the derivatives thereof and aromatic tri-carboxylic acids or the derivatives thereof are mainly used. Examples thereof are trimellitic anhydride, pyromellitic dianhydride, benzene-1,2,3,4-tetracarboxylic acid dianhydride, 3,3',4,4'-benzophenonetetracarboxylic acid dianhydride, 2,2',3,3'-benzophenonetetracarboxylic acid dianhydride, 2,3,3',4'-benzophenonetetracarboxylic acid dianhydride, naphthalene-2,3,6,7-tetracarboxylic acid dianhydride, naphthalene-1,2,5,6-tetracarboxylic acid dianhydride, naphthalene-1,2,4,5-tetracarboxylic acid dianhydride, naphthalene-1,4,5,8-tetracarboxylic acid dianhydride, naphthalene-1,2,6,7-tetracarboxylic acid dianhydride, 4,8-dimethyl-1,2,3,5,6,7-hexahydronaphthalene-1,2,5,6-tetracarboxylic acid dianhydride, 4,8-dimethyl-1, 2,3,5,6,7-hexahydronaphthalene-2,3,6,7-tetracarboxylic acid dianhydride, 2,6-dichloronaphthalene-1,4,5,8-tetracarboxylic acid dianhydride, 2,7-dichloro-naphthalene-1, 4,5,8-tetracarboxylic acid dianhydride, 2,3,6,7-tetrachloronaphthalene-1,4,5,8-tetracarboxylic acid dianhydride, 1,4,5,8-tetrachloronaphthalene-2, 3,6,7-tetracarboxylic acid dianhydride, 3,3',4,4'-diphenyltetracarboxylic acid dianhydride, 2,2',3,3'-diphenyltetracarboxylic acid dianhydride, 2,3,3',4'-diphenyltetracarboxylic acid dianhydride, 3, 3,3",4,4"-p-terphenyltetracarboxylic acid dianhydride, 2,2",3,3"-p-terphenyltetracarboxylic acid dianhydride, 2,3,3",4"-p-terphenyltetracarboxylic acid dianhydride, 2,2-bis(2,3-dicarboxyphenyl)-propane dianhydride, 2,2-bis(3,4-dicarboxyphenyl)-propane dianhydride, bis(2,3-dicarboxyphenyl) ether dianhydride, bis(3,4-dicarboxyphenyl) ether dianhydride, bis(2,3-dicarboxyphenyl)methane dianhydride, bis(3,4-dicarboxyphenyl)-methane dianhydride, bis(2,3-dicarboxyphenyl)sulfone dianhydride, bis(3,4-dicarboxyphenyl)sulfone dianhydride, 1,1-bis(2,3-dicarboxyphenyl)ethane dianhydride, 1,1-bis(3, 4-dicarboxyphenyl)ethane dianhydride, perylene-2,3,8,9-tetracarboxylic acid dianhydride, perylene-3,4,9,10-tetracarboxylic acid dianhydride, perylene-4,5,10,11-tetracarboxylic acid dianhydride, perylene-5,6,11,12-tetracarboxylic acid dianhydride, phenanthrene-1,2,7,8-tetracarboxylic acid dianhydride, phenanthrene-1,2,6,7-tetracarboxylic acid dianhydride, phenanthrene-1,2,9,10-tetracarboxylic acid dianhydride, cyclopentane-1,2,3,4-tetracarboxylic acid dianhydride, pyrazine-2,3,5,6-tetracarboxylic acid dianhydride, pyrrolidine-2,3,4,5-tetracarboxylic acid dianhydride, and thiophene-2,3,4,5-tetracarboxylic acid dianhydride. These are not limitative. These may be used each alone or in admixture of two or more.

$R_2$ in the formulas (1a), (1b) and (1c) is a divalent organic group, and aromatic diamines and/or derivatives thereof are normally used for introduction of the group. As examples thereof, mention may be made of m-phenylene-diamine, 1-isopropyl-2,4-phenylene-diamine, p-phenylene-diamine, 4,4'-diamino-diphenyl- propane, 3,3'-diamino-diphenylpropane, 4,4'-diamino-diphenylethane, 3,3'-diamino-diphenylethane, 4, 4'-diamino-diphenylmethane, 3,3'-diamino-diphenylmethane, 4,4'-diamino-diphenyl sulfide, 3,3'-diamino-diphenyl sulfide, 4,4'-diamino-diphenyl sulfone, 3,3'-diamino- diphenyl sulfone, 4,4'-diamino-diphenyl ether, 3, 3'-diamino-diphenyl ether, benzidine, 3,3'-diamino-biphenyl, 3,3'-dimethyl-4,4'-diamino-biphenyl, 3, 3'-dimethoxy-benzidine, 4,4"-diamino-p-terphenyl, 3, 3"-diamino-p-terphenyl, bis(p-amino-cyclohexyl)methane, bis(p-β-amino-t-butylphenyl) ether, bis(p-β-methyl-δ-amino-pentyl) benzene, p-bis(2-methyl-4-amino-pentyl)-benzene, p-bis(1,1-dimethyl-5-amino-pentyl)benzene, 1,5-diamino-naphthalene, 2,6-diamino-naphthalene, 2, 4-bis(β-amino-t-butyl)toluene, 2,4-diamino-toluene, m-xylene-2,5-diamine, p-xylene-2,5-diamine, m-xylylene-diamine, p-xylylene-diamine, 2,6-diamino-pyridine, 2,5-diamino-pyridiner 2,5-diamino-1,3,4-oxadiazole, 1,4-diamino-cyclohexane, piperazine, methylene-diamine, ethylene-diamine, propylene-diamine, 2,2-dimethyl- propylene-diamine, tetramethylene-diamine, penta-methylene-diamine, hexamethylene-diamine, 2, 5-dimethyl-hexamethylene-diamine, 3-methoxy-hexamethylene-diamine, heptamethylene-diamine, 2,5-dimethyl-heptamethylene-diamine, 3-methyl-heptamethylene-diamine, 4, 4-dimethyl-heptamethylene-diamine, octamethylene-diamine, nonamethylene-diamine, 5-methyl-nonamethylene-diamine, 2,5-dimethyl-nonamethylene-diamine, decamethylene-diamine, 1,10-diamino-1,10-dimethyl-decane, 2, 11-diamino-dodecane, 1,12-diamino-octadecane, 2, 12-diamino-octadecane, 2,17-diamino-eicosane, diamino-siloxane, 2,6-diamino-4-carboxylic benzene, 3, 3'-diamino-4,4'-dicarboxylic benzidine, and 1, 3-bis-(3-aminopropyl) tetramethyldisiloxane. These are not limitative. These may be used each alone or in admixture of two or more.

In the formulas (1a), (1b) and (1c), $R_3$ is a photosensitive group having one to five acryl or methacryl groups and $R_4$ is a photosensitive group having one to five acryl or methacryl groups or methyl group or ethyl group. When the number of acryl (methacryl) groups in $R_3$ or $R_4$ is 0, no crosslinked structure is obtained and this is not preferred. When it is 6 or more, not only the industrial production is difficult, but also the molecular weight is great and compatibility deteriorates. Examples of the compounds for introduction of $R_3$ or $R_4$ are pentaerythritol triacrylate, pentaerythritol trimethacrylate, pentaerythritol acrylate dimethacrylate, pentaerythritol diacrylate methacrylate, dipentaerythritol pentacrylate, dipentaerythritol pentamethacrylate, glycerol diacrylate, glycerol dimethacrylate, glycerol acrylate methacrylate, trimethylolpropane diacrylate, 1,3-diacryloylethyl-5-hydroxyethyl isocyanurate, 1,3-dimethacrylate-5-hydroxyethyl isocyanurate, ethylene glycol-modifed pentaerythritol triacrylate, propylene glycol-modifed pentaerythritol triacrylate, trimethylolpropane diacrylate, trimethylolpropane dimethacrylate, 2-hydroxyethyl methacrylate, 2-hydroxyethyl acrylate, glycidyl methacrylate, glycidyl acrylate, 2-hydroxypropyl methacrylate, 2-hydroxypropyl acrylate, polyethylene glycol-modified methacrylate, polyethylene glycol-modified acrylate, polypropylene glycol-modified acrylate and polypropylene glycol-modifed methacrylate. These are not limitative. These may be used each alone or in admixture of two or more. The methyl group or ethyl group of $R_4$ is normally derived from methanol or ethanol.

$R_5$ is a di- to hexavalent organic group obtained by excluding the hydroxyl group and acryloyloxy group or methacryloyloxy group from the above-mentioned compounds used for introducing $R_3$ or $R_4$, and preferred are di- to trivalent aliphatic groups.

In the polyamic acid esters comprising the structural units represented by the formulas (1a), (1b) and (1c) used in the present invention, the proportion of the structural unit (1a) where $R_3$ is introduced into carboxyl groups is x, the proportion of the structural unit (1b) where $R_3$ is introduced into a part of carboxyl groups and $R_4$ is introduced into the remainder carboxyl groups is y, and the proportion of the structural unit (1c) where carboxyl groups are substituted with R4 is z, and the three structural units are present together. They satisfy $0<x$, $y<100$, $0<z<80$ and $x+y+z=100$, and x, y and z show mol percentages of the respective structural units. In the case of $R_4$ being —$CH_3$ or —$C_2H_5$, when z is 80 or more, the amount of the photosensitive group is small and sensitivity is low and practicality is low.

The polyamic acid esters in the present invention are usually synthesized in the following manner. First, a compound having an alcohol group for introducing polyfunctional photosensitive groups $R_3$ and $R_4$ is dissolved in a solvent and is allowed to react with an excess acid anhydride or a derivative thereof. Thereafter, the remaining carboxyl groups and acid anhydride groups are allowed to react with a diamine, whereby the esters are synthesized.

The glycol ether acetate represented by the formula (2) has hitherto been used as a solvent for epoxy resins, urethane resins, etc., but has never been investigated for use as a solvent or stabilizer for polyimide resins.

In the present invention, the glycol ether acetate has a proper solvency for the polyamic acid ester and the resulting polyamic acid ester solution is superior in shelf stability such as viscosity. Further-more, the resulting photosensitive resin composition is superior in coatability and hardly produces cissings or pin holes when coated on a silicon wafer and is excellent in smoothness.

Examples of the glycol ether acetate are propylene glycol monomethyl ether acetate, propylene glycol monoethyl ether acetate, 1,3-butylene glycol monomethyl ether acetate, 1,3-butylene glycol monoethyl ether acetate, 1,4-butylene glycol monomethyl ether acetate, 3-methyl-3-methoxybutyl acetate and 3-methyl-ethoxybutyl acetate. These are not limitative.

As other solvents or stabilizers used, mention may be made of N,N-dimethylformamide, N,N-dimethylacetamide, N,N-diethylformamide, N,N-diethylacetamide, N,N-dimethylmethoxyacetamide, dimethyl sulfoxide, hexamethylphosphoamide, N-methyl-2-pyrrolidone, pyridine, dimethyl sulfone, tetramethyl sulfone, dimethyltetramethylene sulfone, benzonitrile, butyrolacton, xylene, toluene, cyclohexanone, glycol ether and lactate esters. These are not limitative.

Amount of the glycol ether acetate is preferably 50–500 parts by weight for 100 parts by weight of the polyamic acid ester and this is not limitative. If the amount of the glycol ether acetate is less than 50 parts by weight, no uniform solution can be obtained or when used together with other solvents, a uniform solution can be obtained, but coatability decreases and this is not preferred.

If it is more than 500 parts by weight, a uniform solution can be obtained, but since the amount of the solvent is too much for the resin solid content, the concentration decreases and apparent viscosity of the solution decreases, which causes deterioration of coatability which results in cissings.

Substantially no investigation has been made to use the sulfonamide compound of the present invention as a viscosity stabilizer or polymerization inhibitor.

It has been found for the first time by the present inventors that when the sulfonamide compound is added to the polyamic acid ester solution, the solution viscosity is highly stabilized. The reason why the viscosity stabilizing effect is exhibited by addition of the sulfonamide has not yet been discerned.

Examples of the sulfonamide compound are shown below. These are not limitative.

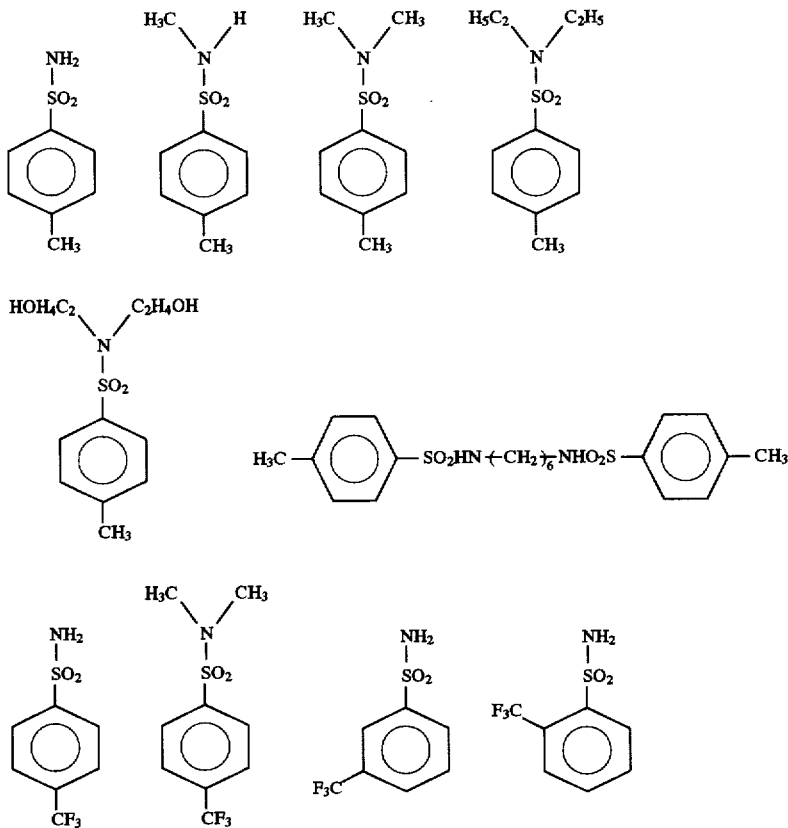

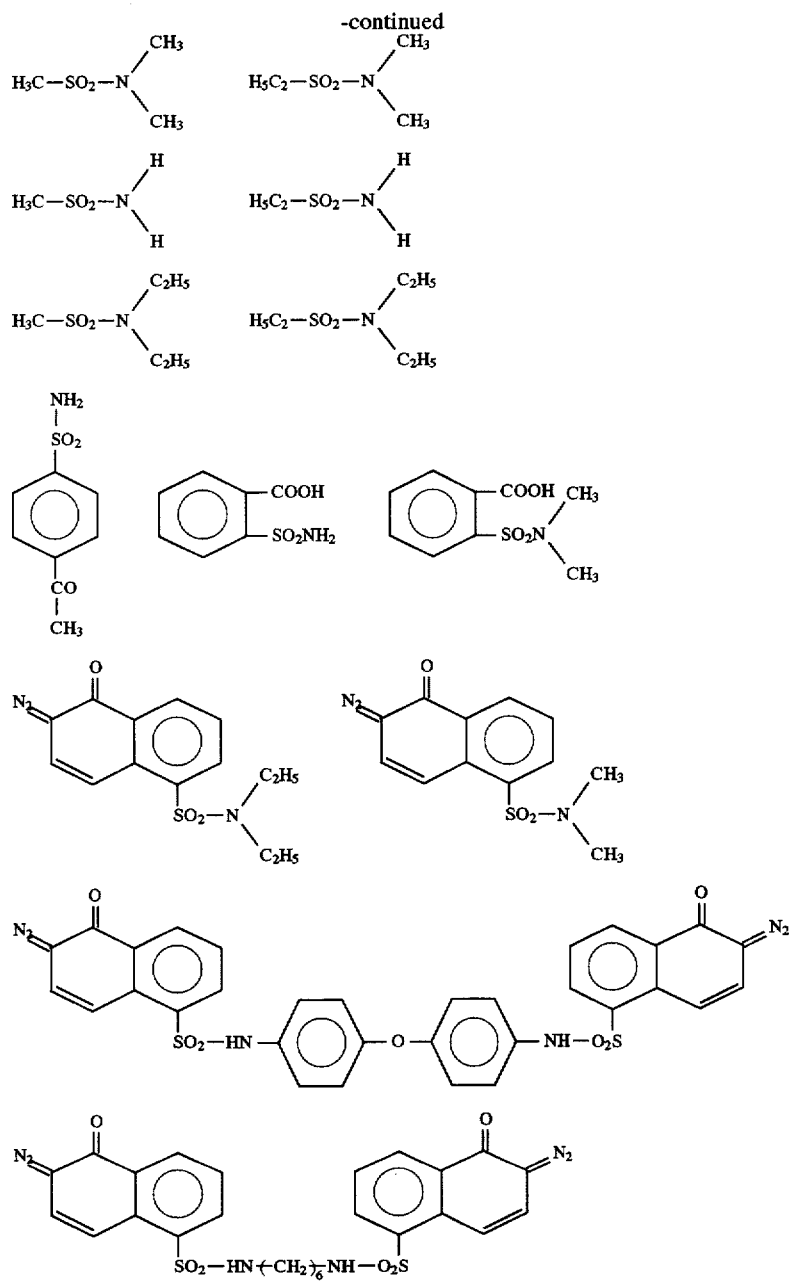
In the present invention, sensitizers may be added in order to improve lithographic characteristics such as sensitivity and resolution. Examples of the senitizers are shown below. These are not limitative.
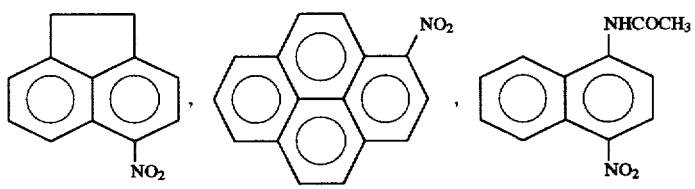

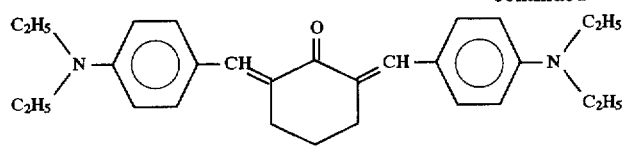
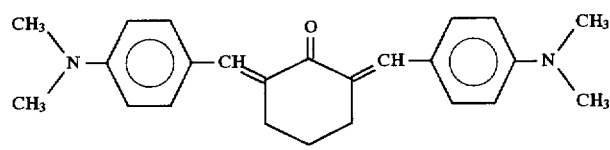
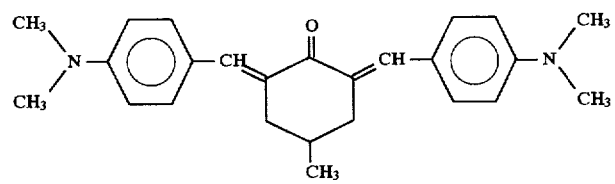
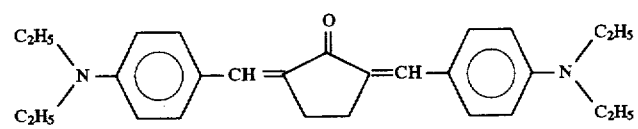
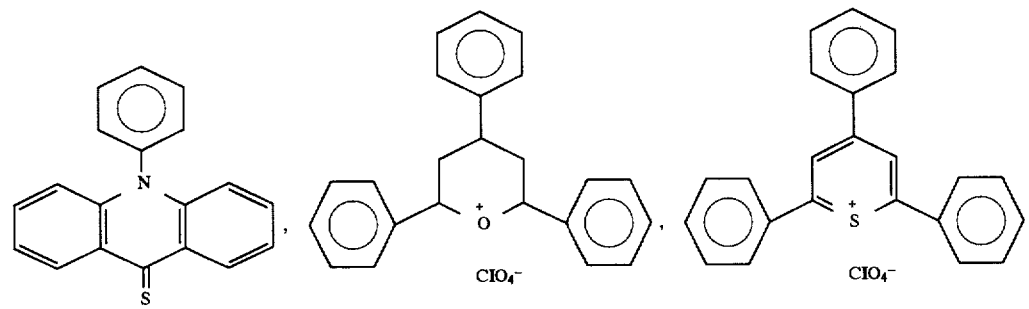
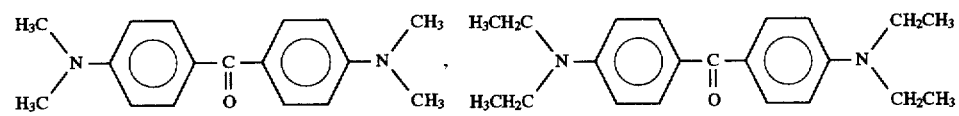
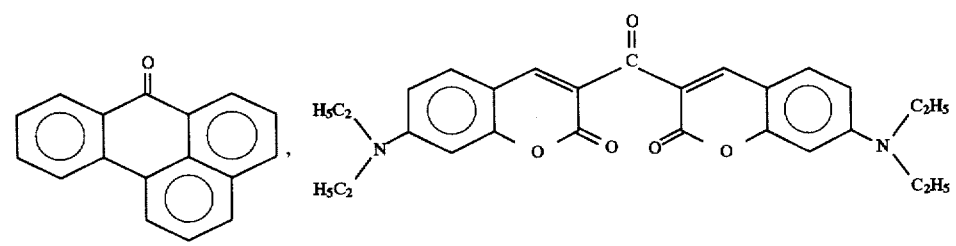
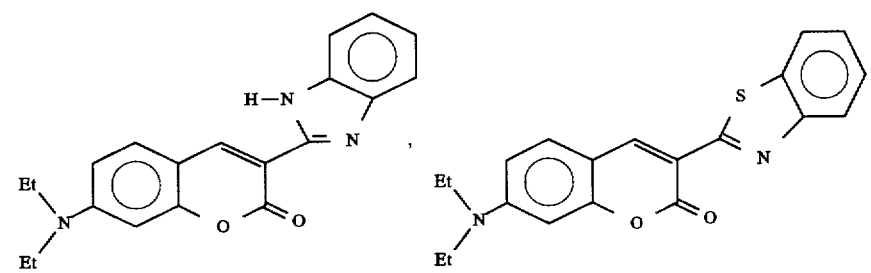

-continued
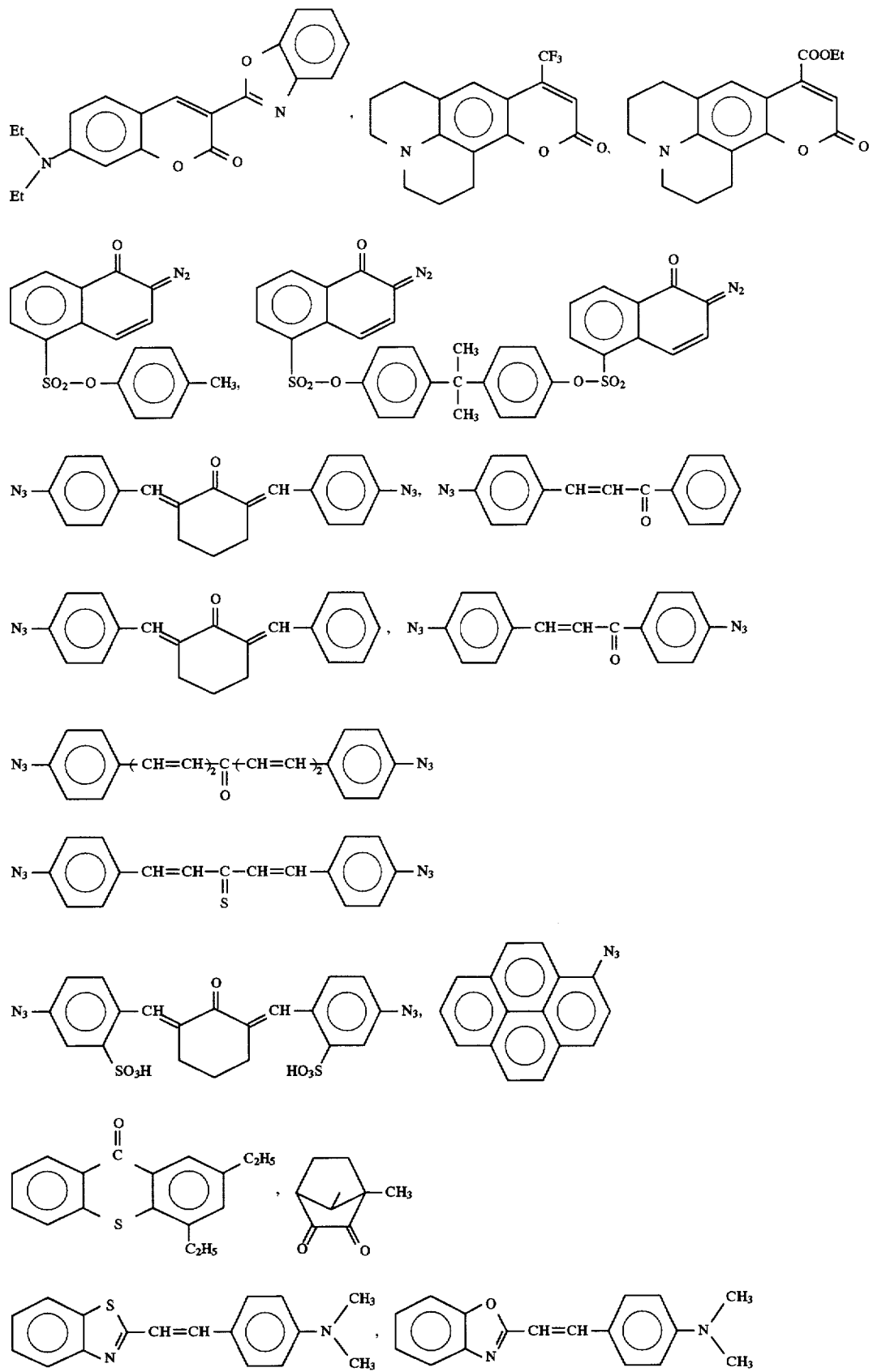

-continued
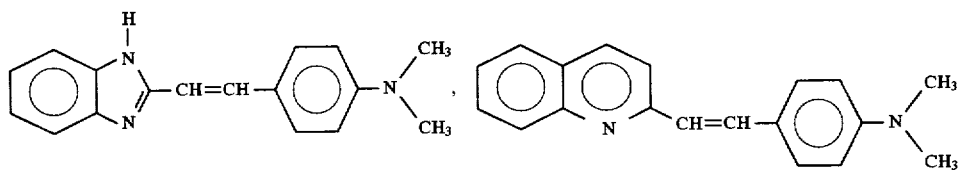
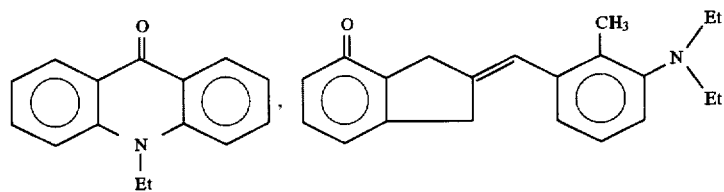
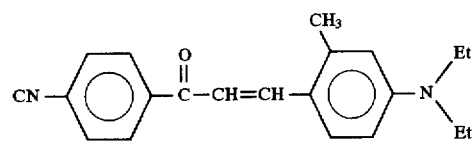
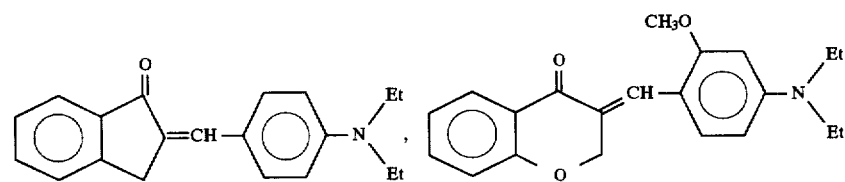
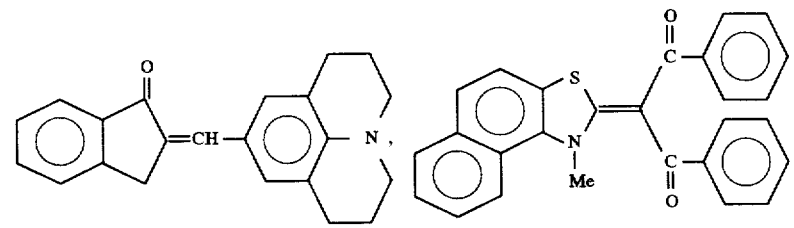
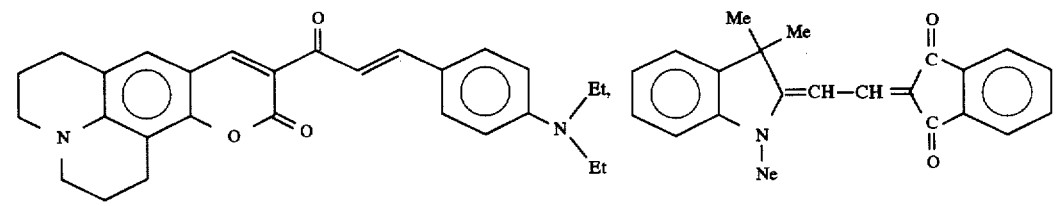
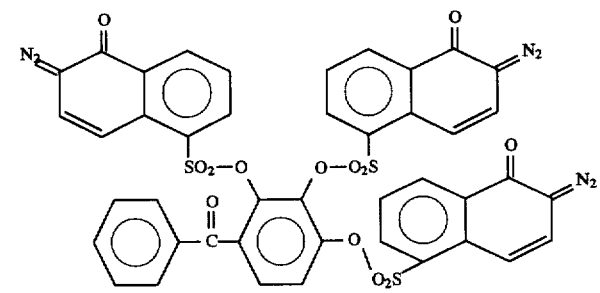

-continued
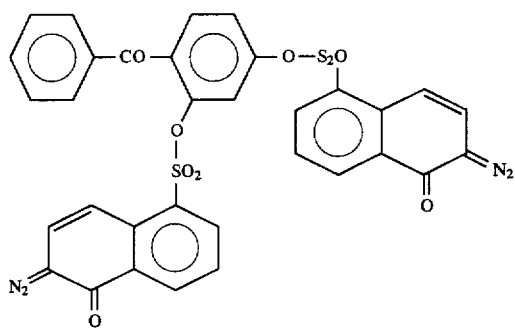
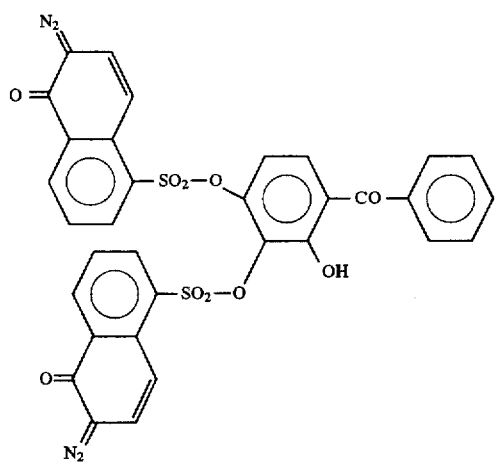
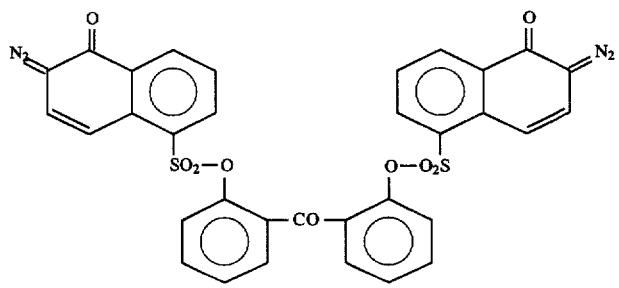
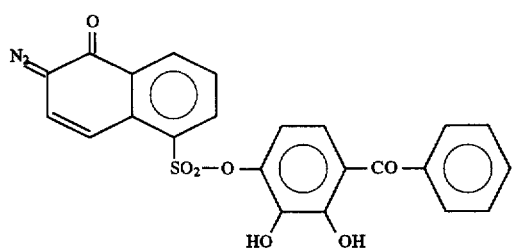
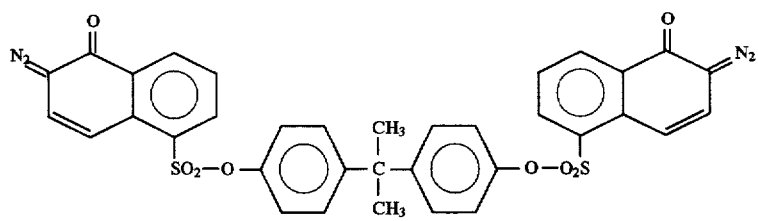

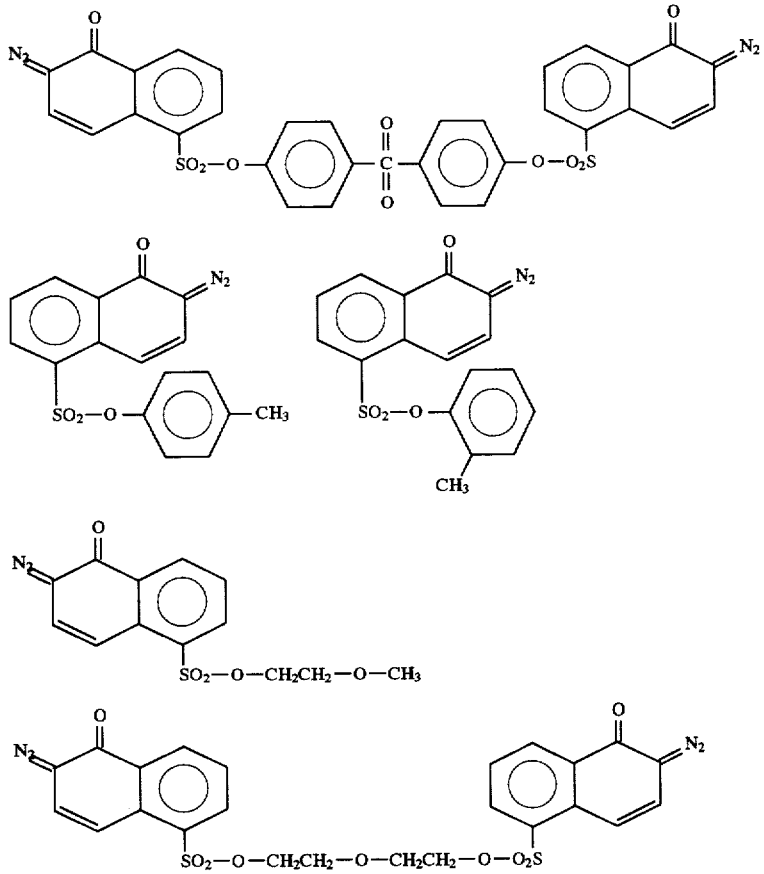
As photopolymerization initiators in the present invention, there can be used the following compounds which are generally used for UV-curing resins. These are not limitative. These may be used each alone or in admixture of two or more.
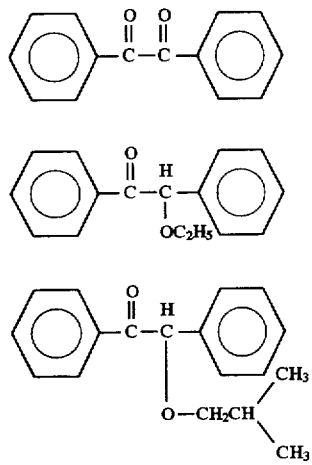
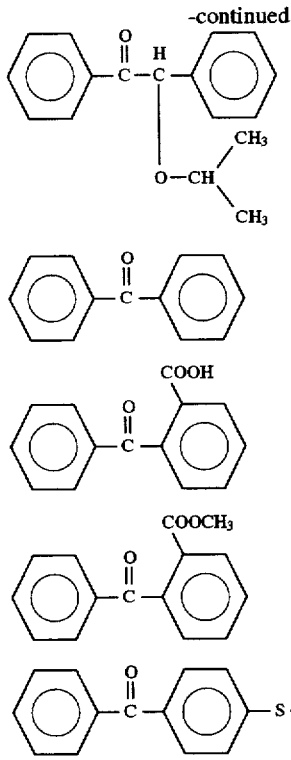

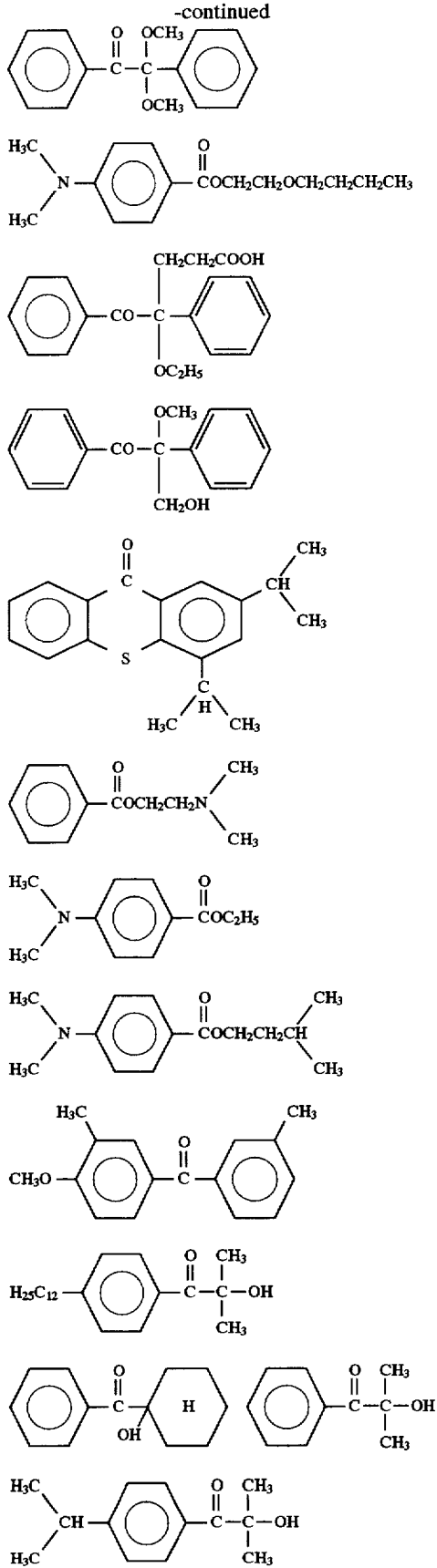
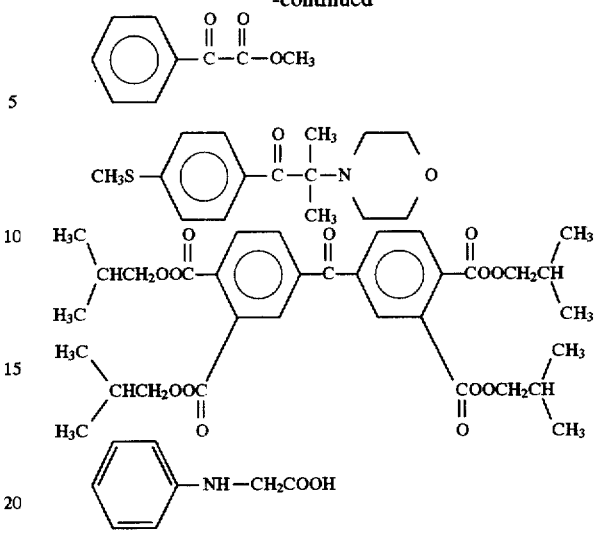

The sensitizers also act as a photopolymerization initiator. Amount of the sensitizer or photopolymerization initiator is preferably 0.1–10 parts by weight for 100 parts by weight of the polyamic acid ester. If it is less than 0.1 part by weight, the amount is too small and the effect to improve the sensitivity can be obtained with difficulty. If it is more than 10 parts by weight, the strength of cured film decreases.

As the shelf stability improvers, mention may be made of 1-phenyl-5-mercapto-1 H-tetrazole, 2-mercaptobenzothiazole, 2-mercaptobenzimidazole, 2-mercaptobenzoxazole, pentaerythritol tetrakis-(thioglycolate),-thioglycolic acid, ammonium thioglycolate, butyl thioglycolate, octyl thioglycolate, methoxybutyl thioglycolate, trimethylolpropane tris-(thioglycolate), ethylene glycol dithioglycolate, β-mercaptopropionic acid, octyl β-mercaptopropionate, trimethylolpropane tris-(β-thiopropionate), pentaerythritol tetrakis-(β-thiopropionate), 1,4-butanediol dithiopropionate, thiosalicylic acid, furfuryl mercaptan, benzyl mercaptan, α-mercaptopropionic acid, p-hydroxythiophenol, p-methylthiophenol, and thiophenol. These are not limitative.

For the purpose of further improvement of sensitivity, a photopolymerizable monomer having a carbon-carbon double bond can be added in the present invention. As examples of the monomer, mention may be made of trimethylolpropane triacrylate, pentaerythritol triacrylate, dipentaerythritol hexaacrylate, 1,6-hexanediol diacrylate, neopentyl glycol diacrylate, ethylene glycol diacrylate, tetraethylene glycol diacrylate, polyethylene glycol diacrylate, 2-hydroxyethyl acrylate, isobornyl acrylate, N-methylolacrylamide, N,N-dimethylacrylamide and methacrylates and methacrylamides corresponding to these acrylates and acrylamides.

The photosensitive resin compositions of the present invention may contain adhesive aids, inhibitors, levelling agents and various fillers.

The method for producing a relief pattern using the photosensitive resin composition of the present invention comprises the following steps. First, the composition is coated onto a suitable support such as silicon wafer, ceramic, aluminum substrate or the like. The coating is carried out by spin coating by a spinner, spray coating by a spray coater, dip coating, print coating, roll coating or the like. Then, the coated film is dried by pre-baking at a low temperature of 60°–120° C and is irradiated with actinic rays in the form of a desired pattern. As the actinic rays, X-rays, electron rays, ultraviolet rays, visible rays and the like can be used, and preferred are those which have a wavelength of 200–500 nm. Next, the unirradiated portion is dissolved with a developer to remove it, thereby to obtain a relief pattern.

The developer used in the present invention comprises (A) 10–40% by weight of iso-propanol and (B) 90–60% by weight of one or two or more selected from N,N-dimethylformamide, N,N-dimethylacetamide, N-methyl-2-pyrrolidone, -butyrolactone, dimethyl sulfoxide and tetrahydrofuran. The combination per se of the solvents (A) and (B) is known, but swelling of the exposed portion can be highly inhibited and a pattern of very high resolution can be obtained by effecting the development with a mixed solvent within the range mentioned above. If content of the (B) is more than 90% by weight in total, the solvency is too high and the exposed portion is also swollen, and if it is less than 60% by weight, dissolution of the unexposed portion is insufficient to cause whitening.

Developing methods include, for example, spray, paddle, dip and ultrasonic developments. Next, the relief pattern formed by the development is rinsed. As the rinsing liquid, there may be used toluene, xylene, ethanol, methanol, iso-propanol, butyl acetate, water and the like. Then, the relief pattern is heat-treated to form an imide ring to obtain a final relief pattern high in heat resistance.

The photosensitive resin composition of the present invention is useful not only for semiconductors, but also for layer insulation films of multilayer circuit boards, cover coat and solder resist film of flexible copper-clad boards, liquid crystal alignment films, etc.

Best Mode for Carrying Out the Invention

The present invention will be explained more specifically by the following examples.

EXAMPLE 1

65.5 g (0.30 mol) of pyromellitic acid dianhydride and 225.5 g (0.70 mol) of 3,3',4,4'-benzophenonetetracarboxylic acid dianhydride were reacted with 456 g (2.00 mols) of 2-hydroxy-1, 3-dimeth-acryloxypropane to esterify the carboxyl group and thereafter, the reaction product was reacted with 170.2 g (0.85 mol) of 4,4'-diaminodiphenyl ether using dicyclohexylcarbodimide as a condensation agent to obtain a polyamic acid ester copolymer. Dicyclohexylurea was filtrated off, followed by reprecipitation with ethanol and the solid was filtrated and dried under reduced pressure. 100 parts by weight of this polyamic acid ester and 6 parts by weight of N-phenylglycine, 1 part by weight of 1-phenyl-5-mercapto-1 H-tetrazole, 1 part by weight of 2-(p-dimethylaminostyryl)benzothiazole and 10 parts by weight of tetraethylene glycol dimethacrylate were dissolved in 200 parts by weight of propylene glycol monomethyl ether acetate to obtain a photosensitive resin composition.

The rate of change in viscosity of the resulting photosensitive resin composition after standing at 23° C. for 1 week was 3.5% and the resin was stable.

The resulting solution was coated onto a silicon wafer of 5 inches by a fully-automatic coater (DSIPN-636 manufactured by Dainippon Screen Mfg., Co., Ltd.) so that the resultant film had a thickness of 5 μm, and was dried at 100° C. for 3 minutes by a hot plate.

Neither pin holes nor peeling occurred in the resulting film. Scattering of thickness on the wafer surface was measured at 30 points by an interference film thickness gauge. The average thickness was 3.65 μm and $\sigma_{n-1}$ was 0.004 μm which indicated the excellence of the film.

EXAMPLE 2

Reaction was effected in the same manner as in Example 1 except that amount of 2-hydroxy-1,3-dimethacryloxypropane was reduced to 228 g and 32 g (1.00 mol) of methanol was added, thereby to obtain a photosensitive resin composition. Evaluation was conducted in the same manner as in Example 1. The rate of change in viscosity was 1.2% and stable. Neither pin holes nor peeling was seen. The average film thickness was 3.26 μm and $\sigma_{n-1}$ was 0.004 μm which indicated the excellence of the film.

EXAMPLE 3

Reaction was effected in the same manner as in Example 1 except that 240 g (2.00 mols) of 2-hydroxy-ethyl methacrylate was used in place of 2-hydroxy-1, 3-dimethacryloxypropane, thereby to obtain a photosensitive resin composition. Evaluation was conducted in the same manner as in Example 1. The rate of change in viscosity was 4.9% and stable. Neither pin holes nor peeling was seen. The average film thickness was 4.23 μm and $\sigma_{n-1}$ was 0.012 μm which indicated the excellence of the film.

EXAMPLE 4

A photosensitive resin composition was obtained by omitting N-phenylglycine, 1-phenyl-5-mercapto-1 H-tetrazole, 2-(p-dimethylaminostyryl)-benzothiazole and tetraethylene glycol dimethacrylate in Example 1. Evaluation was conducted in the same manner as in Example 1. The rate of change in viscosity was 5.3% and stable. Neither pin holes nor peeling was seen. The average film thickness was 2.84 μm and $\sigma_{n-1}$ was 0.014 μm which indicated the excellence of the film.

EXAMPLE 5

To the photosensitive resin composition obtained in Example 1 was further added 3 parts by weight of trimethoxysilylpropyl methacrylate, and the resulting photosensitive resin composition was evaluated in the same manner as in Example 1. The rate of change in viscosity was 2.1% and stable. Neither pin holes nor peeling was seen. The average film thickness was 3.88 μm and $\sigma_{n-1}$ was 0.009 μm which indicated the excellence of the film.

EXAMPLE 6

A photosensitive resin composition was obtained in the same manner as in Example 1 except that 1,3-butylene glycol monomethyl ether acetate was used in place of propylene glycol monomethyl ether acetate and was evaluated in the same manner as in Example 1. The rate of change in viscosity was 3.1% and stable. Neither pin holes nor peeling was seen. The average film thickness was 4.08 μm and $\sigma_{n-1}$ was 0.021 μm which indicated the excellence of the film.

EXAMPLE 7

A photosensitive resin composition was obtained in the same manner as in Example 1 except that 3-methyl-3-methoxybutyl acetate was used in place of propylene glycol monomethyl ether acetate and was evaluated in the same manner as in Example 1. The rate of change in viscosity was 3.1% and stable. Neither pin holes nor peeling was seen. The average film thickness was 3.68 μm and $\sigma_{n-1}$ was 0.006 μm which indicated the excellence of the film. EXAMPLE 8

A photosensitive resin composition was obtained in the same manner as in Example 1 except that 100 parts by weight of N-methyl-2-pyrrolidone was used in place of 100 parts by weight among 200 parts by weight of propylene glycol monomethyl ether acetate and was evaluated in the same manner as in Example 1. The rate of change in viscosity was 1.4% and stable. Neither pin holes nor peeling was seen. The average film thickness was 3.21 μm and $\sigma_{n-1}$ was 0.008 μm which indicated the excellence of the film.

Comparative Example 1

A photosensitive resin composition was obtained in the same manner as in Example 1 except that N-methyl-2-pyrrolidone was used in place of propylene glycol monomethyl ether acetate and was evaluated in the same manner as in Example 1. The rate of change in viscosity was 4.7% and stable.

However, cissings occurred in the portion from the peripheral portion to the center portion of the wafer. The thickness of the resulting film was 3.96 μm and $\sigma_{n-1}$ was 1.14 μm, which meant there was a great deal of scattering.

Comparative Example 2

A photosensitive resin composition was obtained in the same manner as in Example 1 except that propylene glycol monomethyl ether was used in place of propylene glycol monomethyl ether acetate and was similarly evaluated. Neither pin holes nor cissings were seen. The thickness of the resulting film was 3.55 μm and $\sigma_{n-1}$ was 0.009 μm which indicated the excellence of the film, but the rate of change in viscosity was 48%, that is, the viscosity increased much.

Comparative Example 3

A photosensitive resin composition was obtained in the same manner as in Example 1 except that propylene glycol acetate was used in place of propylene glycol monomethyl ether acetate and was similarly evaluated. Neither pin holes nor cissings were seen. The thickness of the resulting film was 3.81 μm and $\sigma_{n-1}$ was 0.012 μm which indicated the excellence of the film, but the rate of change in viscosity was 148%, that is, the viscosity increased much.

EXAMPLE 9

65.5 g (0.30 mol) of pyromellitic acid dianhydride and 225.5 g (0.70 mol) of 3,3',4,4'-benzophenonetetracarboxylic acid dianhydride were reacted with 456.5 g (2.00 mols) of glycerol dimethacrylate to esterify the carboxyl group and thereafter, the reaction product was reacted with 170.2 g (0.85 mol) of 4,4'-diaminodiphenyl ether using dicyclohexyl-carbodimide as a condensation agent to obtain a polyamic acid ester copolymer. Dicyclohexylurea was filtrated off, followed by reprecipitation with ethanol and the solid was filtrated and dried under reduced pressure. 100 parts by weight of this polyamic acid ester and 6 parts by weight of Michler's ketone, 10 parts by weight of tetraethylene glycol diacrylate and 3 parts by weight of a sulfonamide compound represented by the following formula (2) were dissolved in 100 parts by weight of N-methylpyrrolidone to obtain a photosensitive resin composition. The rate of change in viscosity of the resulting solution after left to stand at room temperature for 3 months was 3.8% and was stable.

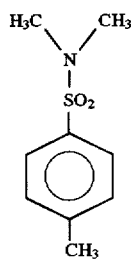

(2)

EXAMPLE 10

A resin composition was obtained in the same manner as in Example 9 except that the amount of glycerol dimethacrylate used in Example 9 was reduced to 228.3 g (1.0 mol) and 32.0 g (1.0 mol) of methanol was added and reaction was effected, and the composition was similarly evaluated. The rate of change in viscosity was 1.4% and stable.

EXAMPLE 11

A resin composition was obtained in the same manner as in Example 9 except that 260.3 g (2 mols) of 2-hydroxyethyl methacrylate was used in place of glycerol dimethacrylate, and the composition was similarly evaluated. The rate of change in viscosity was 7.2% and stable.

EXAMPLE 12

A resin composition was obtained in the same manner as in Example 9 except that 1 part by weight of the sulfonamide compound represented by the following formula (3) was used in place of the sulfonamide compound (2), and the composition was similarly evaluated. The rate of change in viscosity was 2.1% and stable.

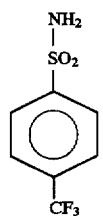

(3)

EXAMPLE 13

A resin composition was obtained in the same manner as in Example 9 except that 1 part by weight of the sulfonamide compound represented by the following formula (4) was used in place of the sulfonamide compound (2), and the composition was similarly evaluated. The rate of change in viscosity was 6.2% and stable.

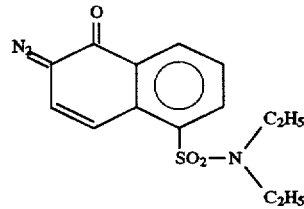

(4)

EXAMPLE 14

A resin composition was obtained in the same manner as in Example 9 except that 1 part by weight of the sulfonamide compound represented by the following formula (5) was used in place of the sulfonamide compound (2), and the composition was similarly evaluated. The rate of change in viscosity was 5.8% and stable.

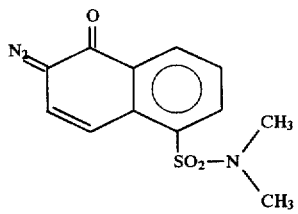
(5)

Comparative Example 4

Example 9 was repeated except that the sulfonamide compound (2) was omitted. The resulting composition was evaluated similarly. The composition gelled after 1 month.

Comparative Example 5

A resin composition was obtained in the same manner as in Example 9 except that 4-methoxyphenol was used in place of the sulfonamide compound (2), and the composition was similarly evaluated. The rate of change in viscosity was 186%, that is, the viscosity increased much.

Comparative Example 6

A resin composition was obtained in the same manner as in Example 9 except that N-nitrosodiphenylamine was used in place of the sulfonamide compound (2), and the composition was similarly evaluated. The rate of change in viscosity was 79%, that is, the viscosity markedly increased.

EXAMPLE 15

65.5 g (0.30 mol) of pyromellitic acid dianhydride and 225.5 g (0.70 mol) of 3,3',4,4'-benzophenonetetracarboxylic acid dianhydride were esterified with 456 g (2.00 mols) of 2-hydroxy-1,3-dimethacryloxypropane and thereafter, the reaction product was converted to an amide with 170.2 g (0.85 mol) of 4,4'-diaminodiphenyl ether to obtain a polyamic acid ester copolymer. This was reprecipitated with ethanol and the solid was filtrated and dried under reduced pressure.

100 parts by weight of this polyamic acid ester and 6 parts by weight of N-phenylglycine, 6 parts by weight of 3-(2'-benzimidazolyl)-7-diethylamino-coumarin, 10 parts by weight of tetraethylene glycol dimethacrylate, 0.05 part by weight of methyl ether hydroquinone and 3 parts by weight of trimethoxysilyl-propyl methacrylate were dissolved in 100 parts by weight of N-methyl-2-pyrrolidone to obtain a photosensitive polyamic acid ester resin composition.

This composition was coated on a silicon wafer by a spinner and dried by placing it on a hot plate of 100° C. for 2 minutes to obtain a film of 8 μm thickness. This was irradiated with a light of 500 mj/cm² through a mask for evaluation of resolution manufactured by Toppan Printing Co., Ltd. by a G-line stepper.

Then, the exposed film was subjected to spray development for 20 seconds and 40 seconds with a developer comprising 80% by weight of N-methyl-2-pyrrolidone and 20% by weight of iso-propanol and rinsed with iso-propanol.

Evaluation of resolution was conducted by microscopically observing the pattern formed by the mask for evaluation of resolution manufactured by Toppan Printing Co., Ltd. and adopting the narrowest width (μm) of the mask which disappeared as a degree of resolution. A high resolution of 6.3–5.6 μm was obtained in developing times of from 20 seconds to 40 seconds.

EXAMPLES 16–19

Relief patterns were formed using the same resin composition as in Example 15 and the developers shown in Table 1 in the same manner as in Example 15. The relation between the developing time and the degree of resolution is shown in Table 1.

EXAMPLE 20

A photosensitive polyamic acid ester composition was prepared with the same blending ratio as in Example 15 except that 70 parts by weight of N-methyl-2-pyrrolidone and 70 parts by weight of propylene glycol methyl ether acetate were used in place of 100 parts by weight of N-methyl-2-pyrrolidone. A relief pattern was formed in the same manner as in Example 15 using the resulting resin composition and the developer shown in Table 1. The relation between the developing time and the degree of resolution is shown in Table 1.

Comparative Examples 7–11

Relief patterns were formed using the same resin composition as of Example 15 and the developers shown in Table 1 in the same manner as in Example 15. The relation between the developing time and the degree of resolution is shown in Table 1.

TABLE 1

| | Example | | | | | | Comparative Example | | | | |
|---|---|---|---|---|---|---|---|---|---|---|---|
| | 15 | 16 | 17 | 18 | 19 | 20 | 7 | 8 | 9 | 10 | 11 |
| Composition of developer | | | | | | | | | | | |
| N-methyl-2-pyrrolidone | 80 | 70 | | | 40 | 80 | 95 | 40 | 80 | 80 | 80 |
| N,N-dimethylacetamide | | | 80 | | | | | | | | |
| 4-Butyrolactone | | | | 80 | 40 | | | | | | |
| iso-Propanol | 20 | 30 | 20 | 20 | 20 | 20 | 5 | 60 | | | |
| Methanol | | | | | | | | | 20 | | |
| Ethanol | | | | | | | | | | 20 | |
| n-Butanol | | | | | | | | | | | 20 |
| Resolution in the case of developing time being 20 seconds (μm) | 6.3 | 6.3 | 6.3 | 6.3 | 6.3 | 7.0 | 11.1 | — | 11.1 | 11.1 | 11.1 |
| Resolution in the case of developing time being 40 seconds (μm) | 5.6 | 5.6 | 5.6 | 5.6 | 5.6 | 5.6 | 14.0 | — | 12.5 | 12.5 | 12.5 |
| Note (Developability) | Proper | Proper | Proper | Proper | Proper | Proper | Swelling | Whitening | Swelling | Proper | Proper |

Industrial Applicability

Using the photosensitive resin composition of the present invention, a film excellent in smoothness and free from pin holes can be easily formed on a support such as silicon wafer. The composition is excellent in shelf stability and viscosity stability and has a high sensitivity. Furthermore, a relief pattern of high resolution can be formed using the composition of the present invention in the fields of multilayer circuit boards, semiconductor devices and microelectronics devices.

We claim:

1. A photosensitive resin composition which consist essentially of, as essential components, (A) a polyamic acid ester consisting of the structural units represented by the following formulas (1a), (1b) and (1c):

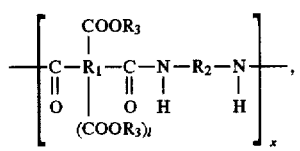
(1a)

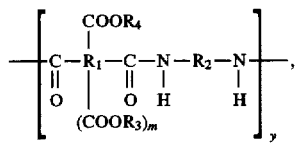
(1b)

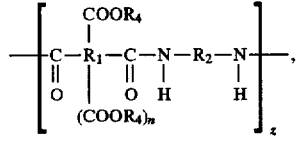
(1c)

wherein $R_1$: a trivalent or tetravalent organic group,
$R_2$: a divalent organic group
$R_3$:

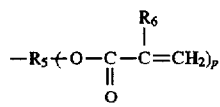

$R_4$:

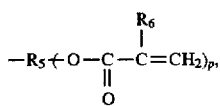

—$CH_3$, or $C_2H_5$ $R_5$: a divalent to hexavalent organic group,
$R_6$: H or $CH_3$ group,
$R_1$, $R_2$, $R_3$, $R_4$, $R_5$ and $R_6$ are independent of one another, $R_3$ and $R_4$ may be the same or different, and $R_4$ and $R_6$ may be the same or different, l, m, n: 0 or 1,
p: an integer of 1–5,
x, y, z: mol % of the structural units (1a), (1b), (1c), 0<x, y<100, 0<z<80 and x+y+z=100, and (B) a stabilizer comprising propylene glycol monomethyl ether acetate.

2. A composition according to claim 1 wherein the trivalent or tetravalent organic group $R_1$ in the formulas (1a), (1b) and (1c) is a residue of an aromatic tetracarboxylic acid or an aromatic tricarboxylic acid.

3. A composition according to claim 1 wherein the divalent organic group $R_2$ in the formulas (1a), (1b) and (1c) is a residue of an aromatic diamine.

4. A composition according to claim 1 wherein the amount of the stabilizer is 50–500 parts by weight based on 100 parts by weight of the polyamic acid ester.

5. A composition according to claim 1 which additionally contains a sensitizer.

6. A composition according to claim 1 which additionally contains a photopolymerization initiator.

7. A composition according to claim 1 wherein $R_5$ is a divalent or trivalent aliphatic group.

* * * * *